United States Patent
Umezawa et al.

(10) Patent No.: US 9,240,204 B2
(45) Date of Patent: Jan. 19, 2016

(54) PERPENDICULAR MAGNETIC RECORDING DISC

(75) Inventors: Teiichiro Umezawa, Singapore (SG); Takenori Kajiwara, Singapore (SG); Tokichiro Sato, Singapore (SG)

(73) Assignee: WD Media (Singapore) Pte. Ltd., Singapore (SG)

( * ) Notice: Subject to any disclaimer, the term of this patent is extended or adjusted under 35 U.S.C. 154(b) by 38 days.

(21) Appl. No.: 13/112,323

(22) Filed: May 20, 2011

(65) Prior Publication Data
US 2012/0189872 A1    Jul. 26, 2012

(30) Foreign Application Priority Data
May 21, 2010 (JP) ................................. 2010-117827

(51) Int. Cl.
- G11B 5/66 (2006.01)
- C23C 16/26 (2006.01)

(52) U.S. Cl.
CPC .. *G11B 5/66* (2013.01); *C23C 16/26* (2013.01)

(58) Field of Classification Search
None
See application file for complete search history.

(56) References Cited

U.S. PATENT DOCUMENTS

| | | | |
|---|---|---|---|
| 6,013,161 A | 1/2000 | Chen et al. |
| 6,063,248 A | 5/2000 | Bourez et al. |
| 6,068,891 A | 5/2000 | O'Dell et al. |
| 6,086,730 A | 7/2000 | Liu et al. |
| 6,099,981 A | 8/2000 | Nishimori |
| 6,103,404 A | 8/2000 | Ross et al. |
| 6,117,499 A | 9/2000 | Wong et al. |
| 6,136,403 A | 10/2000 | Prabhakara et al. |
| 6,143,375 A | 11/2000 | Ross et al. |
| 6,145,849 A | 11/2000 | Bae et al. |
| 6,146,737 A | 11/2000 | Malhotra et al. |
| 6,149,696 A | 11/2000 | Jia |
| 6,150,015 A | 11/2000 | Bertero et al. |
| 6,156,404 A | 12/2000 | Ross et al. |
| 6,159,076 A | 12/2000 | Sun et al. |
| 6,164,118 A | 12/2000 | Suzuki et al. |
| 6,200,441 B1 | 3/2001 | Gornicki et al. |

(Continued)

FOREIGN PATENT DOCUMENTS

| | | |
|---|---|---|
| JP | 2006-309922 | 11/2006 |
| JP | 2010-027197 | 2/2010 |

(Continued)

OTHER PUBLICATIONS

Japanese Office Action dated Apr. 1, 2014 for related Japanese Application No. 2010-117827, 7 pages.

*Primary Examiner* — Holly Rickman
*Assistant Examiner* — Linda Chau (57) ABSTRACT

A perpendicular magnetic disk is provided. The disk includes, on a base and in the order from bottom, a first granular magnetic layer group including a plurality of magnetic layers each having a granular structure, a non-magnetic layer having Ru or a Ru alloy as a main component, a second granular magnetic layer group including a plurality of magnetic layers each having the granular structure, and an auxiliary recording layer having a CoCrPtRu alloy as a main component. Layers closer to a front surface among the plurality of magnetic layers included in the first granular magnetic layer group having an equal or smaller content of Pt. Layers closer to the front surface among the plurality of magnetic layers included in the second granular magnetic layer group having an equal or smaller content of Pt and having an equal or larger content of an oxide.

7 Claims, 7 Drawing Sheets

(56) References Cited

U.S. PATENT DOCUMENTS

| | | | |
|---|---|---|---|
| 6,204,995 B1 | 3/2001 | Hokkyo et al. |
| 6,206,765 B1 | 3/2001 | Sanders et al. |
| 6,210,819 B1 | 4/2001 | Lal et al. |
| 6,216,709 B1 | 4/2001 | Fung et al. |
| 6,221,119 B1 | 4/2001 | Homola |
| 6,248,395 B1 | 6/2001 | Homola et al. |
| 6,261,681 B1 | 7/2001 | Suekane et al. |
| 6,270,885 B1 | 8/2001 | Hokkyo et al. |
| 6,274,063 B1 | 8/2001 | Li et al. |
| 6,283,838 B1 | 9/2001 | Blake et al. |
| 6,287,429 B1 | 9/2001 | Moroishi et al. |
| 6,290,573 B1 | 9/2001 | Suzuki |
| 6,299,947 B1 | 10/2001 | Suzuki et al. |
| 6,303,217 B1 | 10/2001 | Malhotra et al. |
| 6,309,765 B1 | 10/2001 | Suekane et al. |
| 6,358,636 B1 | 3/2002 | Yang et al. |
| 6,362,452 B1 | 3/2002 | Suzuki et al. |
| 6,363,599 B1 | 4/2002 | Bajorek |
| 6,365,012 B1 | 4/2002 | Sato et al. |
| 6,381,090 B1 | 4/2002 | Suzuki et al. |
| 6,381,092 B1 | 4/2002 | Suzuki |
| 6,387,483 B1 | 5/2002 | Hokkyo et al. |
| 6,391,213 B1 | 5/2002 | Homola |
| 6,395,349 B1 | 5/2002 | Salamon |
| 6,403,919 B1 | 6/2002 | Salamon |
| 6,408,677 B1 | 6/2002 | Suzuki |
| 6,426,157 B1 | 7/2002 | Hokkyo et al. |
| 6,429,984 B1 | 8/2002 | Alex |
| 6,482,330 B1 | 11/2002 | Bajorek |
| 6,482,505 B1 | 11/2002 | Bertero et al. |
| 6,500,567 B1 | 12/2002 | Bertero et al. |
| 6,528,124 B1 | 3/2003 | Nguyen |
| 6,548,821 B1 | 4/2003 | Treves et al. |
| 6,552,871 B2 | 4/2003 | Suzuki et al. |
| 6,565,719 B1 | 5/2003 | Lairson et al. |
| 6,566,674 B1 | 5/2003 | Treves et al. |
| 6,571,806 B2 | 6/2003 | Rosano et al. |
| 6,628,466 B2 | 9/2003 | Alex |
| 6,664,503 B1 | 12/2003 | Hsieh et al. |
| 6,670,055 B2 | 12/2003 | Tomiyasu et al. |
| 6,682,807 B2 | 1/2004 | Lairson et al. |
| 6,683,754 B2 | 1/2004 | Suzuki et al. |
| 6,730,420 B1 | 5/2004 | Bertero et al. |
| 6,743,528 B2 | 6/2004 | Suekane et al. |
| 6,759,138 B2 | 7/2004 | Tomiyasu et al. |
| 6,778,353 B1 | 8/2004 | Harper |
| 6,795,274 B1 | 9/2004 | Hsieh et al. |
| 6,855,232 B2 | 2/2005 | Jairson et al. |
| 6,857,937 B2 | 2/2005 | Bajorek |
| 6,893,748 B2 | 5/2005 | Bertero et al. |
| 6,899,959 B2 | 5/2005 | Bertero et al. |
| 6,916,558 B2 | 7/2005 | Umezawa et al. |
| 6,939,120 B1 | 9/2005 | Harper |
| 6,946,191 B2 | 9/2005 | Morikawa et al. |
| 6,967,798 B2 | 11/2005 | Homola et al. |
| 6,972,135 B2 | 12/2005 | Homola |
| 7,004,827 B1 | 2/2006 | Suzuki et al. |
| 7,006,323 B1 | 2/2006 | Suzuki |
| 7,016,154 B2 | 3/2006 | Nishihira |
| 7,019,924 B2 | 3/2006 | McNeil et al. |
| 7,045,215 B2 | 5/2006 | Shimokawa |
| 7,070,870 B2 | 7/2006 | Bertero et al. |
| 7,090,934 B2 | 8/2006 | Hokkyo et al. |
| 7,099,112 B1 | 8/2006 | Harper |
| 7,105,241 B2 | 9/2006 | Shimokawa et al. |
| 7,119,990 B2 | 10/2006 | Bajorek et al. |
| 7,147,790 B2 | 12/2006 | Wachenschwanz et al. |
| 7,161,753 B2 | 1/2007 | Wachenschwanz et al. |
| 7,166,319 B2 | 1/2007 | Ishiyama |
| 7,166,374 B2 | 1/2007 | Suekane et al. |
| 7,169,487 B2 | 1/2007 | Kawai et al. |
| 7,174,775 B2 | 2/2007 | Ishiyama |
| 7,179,549 B2 | 2/2007 | Malhotra et al. |
| 7,184,139 B2 | 2/2007 | Treves et al. |
| 7,196,860 B2 | 3/2007 | Alex |
| 7,199,977 B2 | 4/2007 | Suzuki et al. |
| 7,208,236 B2 | 4/2007 | Morikawa et al. |
| 7,220,500 B1 | 5/2007 | Tomiyasu et al. |
| 7,229,266 B2 | 6/2007 | Harper |
| 7,239,970 B2 | 7/2007 | Treves et al. |
| 7,252,897 B2 | 8/2007 | Shimokawa et al. |
| 7,277,254 B2 | 10/2007 | Shimokawa et al. |
| 7,281,920 B2 | 10/2007 | Homola et al. |
| 7,292,329 B2 | 11/2007 | Treves et al. |
| 7,301,726 B1 | 11/2007 | Suzuki |
| 7,302,148 B2 | 11/2007 | Treves et al. |
| 7,305,119 B2 | 12/2007 | Treves et al. |
| 7,314,404 B2 | 1/2008 | Singh et al. |
| 7,320,584 B1 | 1/2008 | Harper et al. |
| 7,329,114 B2 | 2/2008 | Harper et al. |
| 7,375,362 B2 | 5/2008 | Treves et al. |
| 7,420,886 B2 | 9/2008 | Tomiyasu et al. |
| 7,425,719 B2 | 9/2008 | Treves et al. |
| 7,471,484 B2 | 12/2008 | Wachenschwanz et al. |
| 7,498,062 B2 | 3/2009 | Calcaterra et al. |
| 7,531,485 B2 | 5/2009 | Hara et al. |
| 7,537,846 B2 | 5/2009 | Ishiyama et al. |
| 7,549,209 B2 | 6/2009 | Wachenschwanz et al. |
| 7,569,490 B2 | 8/2009 | Staud |
| 7,597,792 B2 | 10/2009 | Homola et al. |
| 7,597,973 B2 | 10/2009 | Ishiyama |
| 7,608,193 B2 | 10/2009 | Wachenschwanz et al. |
| 7,632,087 B2 | 12/2009 | Homola |
| 7,656,615 B2 | 2/2010 | Wachenschwanz et al. |
| 7,682,546 B2 | 3/2010 | Harper |
| 7,684,152 B2 | 3/2010 | Suzuki et al. |
| 7,686,606 B2 | 3/2010 | Harper et al. |
| 7,686,991 B2 | 3/2010 | Harper |
| 7,695,833 B2 | 4/2010 | Ishiyama |
| 7,722,968 B2 | 5/2010 | Ishiyama |
| 7,733,605 B2 | 6/2010 | Suzuki et al. |
| 7,736,765 B2 * | 6/2010 | Wu et al. ....................... 428/829 |
| 7,736,768 B2 | 6/2010 | Ishiyama |
| 7,755,861 B1 | 7/2010 | Li et al. |
| 7,758,732 B1 | 7/2010 | Calcaterra et al. |
| 7,833,639 B2 | 11/2010 | Sonobe et al. |
| 7,833,641 B2 | 11/2010 | Tomiyasu et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |
| 8,092,931 B2 | 1/2012 | Ishiyama et al. |
| 8,100,685 B1 | 1/2012 | Harper et al. |
| 8,101,054 B2 | 1/2012 | Chen et al. |
| 8,125,723 B1 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B1 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |
| 8,257,783 B2 | 9/2012 | Suzuki et al. |
| 8,298,609 B1 | 10/2012 | Liew et al. |
| 8,298,689 B2 | 10/2012 | Sonobe et al. |
| 8,309,239 B2 | 11/2012 | Umezawa et al. |
| 8,316,668 B1 | 11/2012 | Chan et al. |

(56) References Cited

U.S. PATENT DOCUMENTS

| | | |
|---|---|---|
| 8,331,056 B2 | 12/2012 | O'Dell |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 2002/0060883 A1 | 5/2002 | Suzuki |
| 2003/0022024 A1 | 1/2003 | Wachenschwanz |
| 2004/0022387 A1 | 2/2004 | Weikle |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0036223 A1 | 2/2005 | Wachenschwanz et al. |
| 2005/0058855 A1* | 3/2005 | Girt ............... 428/694 TS |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0196642 A1* | 9/2005 | Nakamura et al. ........... 428/832 |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0070549 A1 | 3/2007 | Suzuki et al. |
| 2007/0245909 A1 | 10/2007 | Homola |
| 2008/0075845 A1 | 3/2008 | Sonobe et al. |
| 2008/0093760 A1 | 4/2008 | Harper et al. |
| 2008/0113221 A1* | 5/2008 | Hirayama et al. ........... 428/810 |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0311557 A1 | 12/2009 | Onoue et al. |
| 2010/0046116 A1* | 2/2010 | Shimizu et al. ............... 360/110 |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |

FOREIGN PATENT DOCUMENTS

| | | |
|---|---|---|
| WO | 2009123161 | 10/2009 |
| WO | 2010032766 | 3/2010 |

* cited by examiner

| | COMPOSITION OF FIRST LOWER MAGNETIC LAYER AND FIRST UPPER MAGNETIC LAYER (CONTENT OF OXIDE CHANGED) | SNR [dB] |
|---|---|---|
| EXAMPLE 8 | 93(70Co-10Cr-20Pt)-7(Cr2O3) | 17.02 |
| EXAMPLE 9 | 93(71Co-10Cr-19Pt)-7(Cr2O3) | 16.98 |
| EXAMPLE 10 | 93(67Co-10Cr-23Pt)-7(Cr2O3) | 16.96 |
| EXAMPLE 11 | 93(73Co-10Cr-17Pt)-7(Cr2O3) | 16.74 |
| EXAMPLE 12 | 93(64Co-10Cr-26Pt)-7(Cr2O3) | 16.67 |

(b)

| | COMPOSITION OF FIRST LOWER MAGNETIC LAYER AND FIRST UPPER MAGNETIC LAYER (CONTENT OF Pt CHANGED) | SNR [dB] |
|---|---|---|
| EXAMPLE 13 | 97(70Co-10Cr-20Pt)-3(Cr2O3) | 16.72 |
| EXAMPLE 14 | 95(70Co-10Cr-20Pt)-5(Cr2O3) | 16.94 |
| EXAMPLE 15 | 93(70Co-10Cr-20Pt)-7(Cr2O3) | 17.02 |
| EXAMPLE 16 | 98(70Co-10Cr-20Pt)-2(Cr2O3) | 16.50 |
| EXAMPLE 17 | 91(70Co-10Cr-20Pt)-9(Cr2O3) | 16.74 |

*Fig.5*

| | COMPOSITION OF FIRST UPPER MAGNETIC LAYER | COMPOSITION OF SECOND UPPER MAGNETIC LAYER | SNR (dB) |
|---|---|---|---|
| EXAMPLE 10 | 93(70Co-10Cr-20Pt)-7(Cr2O3) | 86(67Co-14Cr-16Pt-3Ru)-6(SiO2)-5(TiO2) | 17.82 |
| EXAMPLE 18 | 93(70Co-10Cr-20Pt)-7(Cr2O3) | 93(68Co-14Cr-18Pt)-7(Cr2O3) | 18.73 |
| EXAMPLE 19 | 93(71Co-11Cr-18Pt)-5(SiO2)-5(TiO2) | 86(67Co-14Cr-16Pt-3Ru)-6(SiO2)-5(TiO2) | 18.57 |

*Fig.6*

|  |  | FILM THICKNESS [nm] | TOTAL FILM THICKNESS [nm] | SNR [dB] |
|---|---|---|---|---|
| EXAMPLE 19 | AUXILIARY RECORDING LAYER | 3.3 |  | 17.02 |
|  | SECOND UPPER MAGNETIC LAYER | 1.3 | 4.5 |  |
|  | FIRST UPPER MAGNETIC LAYER | 3.2 |  |  |
|  | THIRD LOWER MAGNETIC LAYER | 8.8 |  |  |
|  | SECOND LOWER MAGNETIC LAYER | 4.6 | 14.5 |  |
|  | FIRST LOWER MAGNETIC LAYER | 1.1 |  |  |
| EXAMPLE 20 | AUXILIARY RECORDING LAYER | 3.3 |  | 16.61 |
|  | SECOND UPPER MAGNETIC LAYER | 8.8 | 12.0 |  |
|  | FIRST UPPER MAGNETIC LAYER | 3.2 |  |  |
|  | THIRD LOWER MAGNETIC LAYER | 1.5 |  |  |
|  | SECOND LOWER MAGNETIC LAYER | 4.6 | 7.2 |  |
|  | FIRST LOWER MAGNETIC LAYER | 1.1 |  |  |

*Fig. 7*

PERPENDICULAR MAGNETIC RECORDING DISC

TECHNICAL FIELD

The present invention relates to a perpendicular magnetic disk implemented on an HDD (hard disk drive) of a perpendicular magnetic recording type or the like.

BACKGROUND ART

With an increase in capacity of information processing in recent years, various information recording technologies have been developed. In particular, the surface recording density of an HDD using magnetic recording technology is continuously increasing at an annual rate of approximately 60%. In recent years, an information recording capacity exceeding 320 gigabytes per platter has been desired for a magnetic recording medium with a 2.5-inch diameter for use in an HDD or the like. To fulfill such demands, an information recording density exceeding 500 gigabits per square inch is desired to be achieved.

Important factors for increasing recording density of the perpendicular magnetic disk include, for example, an improvement in TPI (Tracks per Inch) by narrowing the track width, ensuring electromagnetic conversion characteristics, such as a Signal-to-Noise Ratio (SNR) and an overwrite characteristic (OW characteristic) indicating ease of writing of a signal at the time of improving BPI (Bits per Inch), and further ensuring heat fluctuation resistance with recording bits decreased due to the above. Among these, an increase in SNR and an improvement in overwrite characteristic in a high recording density condition are important.

The granular magnetic layer is effective in increasing the SNR because an oxide phase and a metal phase are separated to form fine particles. For increasing recording density, the particles of the granular magnetic layer are required to be microfabricated. With microfabrication, however, magnetic energy is also decreased, thereby causing a problem of heat fluctuations. On the other hand, to avoid the problem of heat fluctuations, magnetic anisotropy of a medium is required to be increased. With an increase of magnetic anisotropy, a coercive force is also increased, thereby making it difficult to write. That is, while prevention of heat fluctuation and improvement of the overwrite characteristic are to be intrinsically traded off for each other, there is a demand for enhancing both of these.

Patent Document 1 suggests a write auxiliary layer (corresponding to an auxiliary recording layer) formed above or below a main recording layer and in contact with that main recording layer. In Patent Document 1, the main recording layer is a magnetic layer having a granular structure, and the write auxiliary layer is made of a CoCr alloy (for example, CoCrPtB). In Patent Document 1, by providing the write auxiliary layer, the overwrite characteristic and heat fluctuation resistance can both be improved.

PRIOR ART DOCUMENT

Patent Document

Patent Document 1: Japanese Unexamined Patent Application Publication No. 2006-309922

DISCLOSURE OF INVENTION

Problems to be Solved by the Invention

While the auxiliary recording layer improves the overwrite characteristic and heat fluctuation resistance, it serves as a noise source because of magnetic continuity in an in-plane direction, and therefore write spread tends to become large. Therefore, as the film thickness of the auxiliary recording layer is thicker, noise is larger, thereby inhibiting an increase in recording density. Moreover, when the film thickness of the auxiliary recording layer is thick, magnetic spacing between a magnetic head and a soft magnetic layer is increased, and the layer supposed to support writing contrarily acts in a direction of inhibiting writing due to the film thickness of its own. Thus, in order to reduce noise and improve the overwrite characteristic, there is a demand for making the auxiliary recording layer thinner.

However to obtain an improvement in overwrite characteristic by the auxiliary recording layer, the product of magnetization film thickness (the product of saturation magnetization Ms and a film thickness t: Ms·t) having a size according to a coercive force of a magnetic layer having a granular structure is required. That is, Ms·t capable of sufficiently reducing the coercive force of the granular magnetic structure to the extent of allowing recording from the magnetic head is required. The reason for this is that, as Ms·t of the auxiliary recording layer is higher, exchange coupling among magnetic particles of the granular magnetic layer can be more strengthened, and therefore the coercive force can be reduced.

On the other hand, in the granular magnetic layer, in order to achieve high recording density, the particle diameter of the magnetic particles tends to be decreased, and thus magnetic anisotropy and coercive force tend to be increased more. For this reason, further higher Ms·t is required for the auxiliary recording layer, and it is difficult to dramatically making the film thinner.

In view of these problems, an object of the present invention is to make a film thinner while keeping the function as an auxiliary recording layer and increase an SNR.

Means for Solving the Problem

To solve the above problem, as a result of diligent studies by the inventors, the inventors thought that, if the coercive force of the granular magnetic layer, which is to be assisted by the auxiliary recording layer in writing, is smaller, Ms·t of the auxiliary recording layer can be made smaller, thereby allowing the auxiliary recording layer to be made thinner. The inventors also thought that, even when the coercive force of the entire granular magnetic layer is not made smaller, the auxiliary recording layer can be made thinner as long as the range of assistance by the auxiliary recording layer in magnetization reversal can be restricted to a part of the granular magnetic layer. Furthermore, after studies about various conditions in order to increase the SNR, the present invention was completed.

That is, to solve the problems above, a typical structure of a perpendicular magnetic disk according to the present invention includes: on a base and in the order from bottom, a first granular magnetic layer group including a plurality of magnetic layers each having a granular structure; a non-magnetic layer having Ru or a Ru alloy as a main component; a second granular magnetic layer group including a plurality of magnetic layers each having the granular structure; and an auxiliary recording layer having a CoCrPtRu alloy as a main component, layers closer to a front surface among the plurality of magnetic layers included in the first granular magnetic layer group having an equal or smaller content of Pt, and layers closer to the front surface among the plurality of magnetic layers included in the second granular magnetic layer group having an equal or smaller content of Pt and having an equal or larger content of an oxide.

According to the structure above, by dividing the first granular magnetic layer group (hereinafter simply referred to as a "lower group") and the second granular magnetic layer group (hereinafter simply referred to as an "upper group") by the non-magnetic layer, the magnetic interaction between the upper group and the lower group is weakened. For this reason, when writing is performed from the magnetic head, the auxiliary recording layer is first subjected to magnetization reversal, the upper group ferromagnetically coupled thereto is then subjected to magnetization reversal, and next the lower group ferromagnteically coupled to the upper group is subjected to magnetization reversal. As such, by restricting the magnetic layer that is to be assisted by the auxiliary recording layer in magnetization reversal to part (the upper group) of the granular layer, the effect of reducing coercive force required for the auxiliary recording layer can be decreased. With this, the film of the auxiliary recording layer can be made thinner. Therefore, it is possible to reduce noise occurring from the auxiliary recording layer can be reduced, improve the SNR, and increase recording density.

Here, the upper group and the lower group each have a structure similar to that in a general magnetic recording disk. That is, in either group, a layer with more Pt and high crystal orientation is formed on a base side and a layer with a more oxide and high SNR is formed on a surface side, and an auxiliary recording layer (or an auxiliary recording layer and an upper group) is provided thereon to prevent heat fluctuation. From this, unlike the case of simply increasing the thickness of the auxiliary recording layer or providing two auxiliary recording layers, it is possible to make the film thinner while keeping the function as the auxiliary recording layer and increase the SNR.

A lowermost layer of each of the first granular magnetic layer group and the second granular magnetic layer group preferably has Pt equal to or larger than 18 atomic percent and equal to or smaller than 24 atomic percent and an oxide equal to or larger than 4 mole percent and equal to or smaller than 8 mole percent.

With this, the lowermost layer of each of the lower group and the upper group can be made as a magnetic layer having high crystal orientation and coercive force. Also, as described above, since the magnetic layer upper than these layers has Pt equivalent to or smaller than that of the lowermost layer and an oxide equivalent to or larger than that thereof, the magnetic layer can be made as a layer having a high SNR. With this, it is possible to reduce the film thickness while obtaining high coercive force and SNR.

Preferably, the lowermost layer of each of the first granular magnetic layer group and the second granular magnetic layer group does not contain SiO2 and TiO2 as an oxide forming a grain boundary having the granular structure, and a layer located second when viewed from a board side of each of the first granular magnetic layer group and the second granular magnetic layer group contain SiO2 or TiO2 as an oxide forming a grain boundary having the granular structure.

Cr2O3 has low separability but high crystal orientation compared with SiO2 and TiO2 often used for a granular magnetic layer. Therefore, by adding Cr2O3 to the lowermost layer, crystal orientation the recording layer positioned thereabove can be improved. And, by using SiO2 or TiO2 for the second layer in each magnetic layer group, separability can be improved, and crystal orientation and separability can both be achieved as a whole.

When a sum of a film thickness of the first granular magnetic layer group, a film thickness of the second granular magnetic layer group, and a film thickness of the auxiliary ground layer is taken as T1, a sum of the film thickness of the second granular magnetic layer group and the film thickness of the auxiliary ground layer is taken as T2, and the film thickness of the auxiliary magnetic layer is T3, T1/2>T2 and T2/2>T3 are preferably satisfied.

With the relation among the film thicknesses as described above, the operation can be ensured such that the auxiliary recording layer is subjected to magnetization reversal, the upper group is next subjected to magnetization reversal, and then the lower group is subjected to magnetization reversal. Therefore, these layers can be reliably subjected to magnetization reversal in a chain-reacting manner.

A total film thickness of the second granular magnetic layer group is preferably equal to or larger than 1.5 nm and equal to or smaller than 7.0 nm and, more preferably, equal to or larger than 2.0 nm and equal to or smaller than 6.0 nm.

The reason for the above is that, if the film thickness is thinner than 1.5 nm, the lower group is less prone to magnetization reversal even with the auxiliary recording layer and the upper group being put together and, if the film thickness is thicker than 7.0 nm, the effect of being able to make the auxiliary recording layer thinner cannot be obtained.

Effect of the Invention

According to the present invention, it is possible to make a film thinner while keeping the function as an auxiliary recording layer and increase an SNR.

BEST MODES FOR CARRYING OUT THE INVENTION

In the following, with reference to the attached drawings, preferred embodiments of the present invention are described in detail. The dimensions, materials, and others such as specific numerical values shown in these embodiments are merely examples so as to facilitate understanding of the invention, and are not meant to restrict the present invention unless otherwise specified. Note that, in the specification and drawings, components having substantially the same functions and structures are provided with the same reference character and are not redundantly described, and components not directly relating to the present invention are not shown in the drawings.

(Perpendicular Magnetic Disk)

Figure 1:
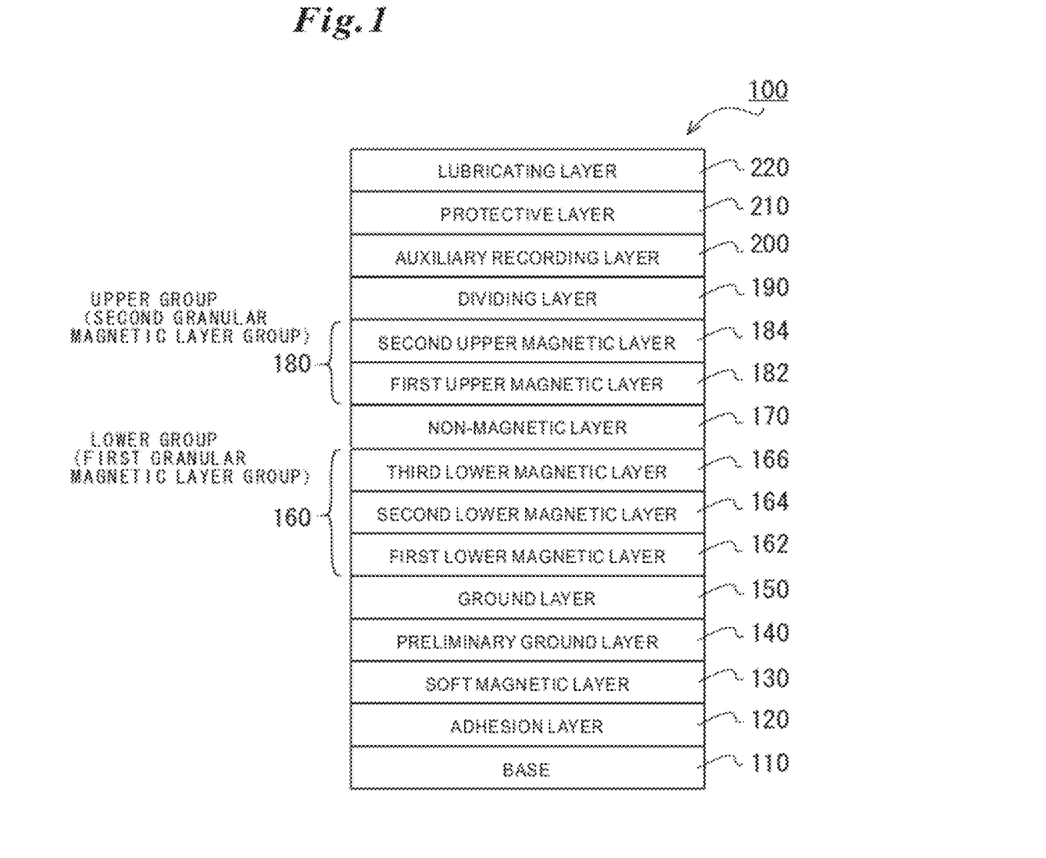
FIG. 1 A diagram for describing the structure of a perpendicular magnetic disk.

FIG. 1 is a diagram for describing the structure of a perpendicular magnetic disk 100 according to a first embodiment. The perpendicular magnetic disk 100 depicted in FIG. 1 is configured of a base 110, an adhesion layer 120, a soft magnetic layer 130, a preliminary ground layer 140, a ground layer 150, a first granular magnetic layer group (hereinafter referred to as a "lower group 160"), a non-magnetic layer 170, a second granular magnetic layer group (hereinafter referred to as an "upper group 180"), a dividing layer 190, an auxiliary recording layer 200, a protective layer 210, and a lubricating layer 220.

As the base 110, for example, a glass disk obtained by molding amorphous aluminosilicate glass in a disk shape by direct pressing can be used. Note that the type, size, thickness, and others of the glass disk are not particularly restricted. Examples of a material of the glass disk include, for example, aluminosilicate glass, soda lime glass, soda aluminosilicate glass, aluminoborosilicate glass, borosilicate glass, quartz glass, chain silicate glass, and glass ceramic such as crystallized glass. By sequentially grinding, polishing, and then chemically strengthening any of these glass disks, the flat, nonmagnetic base 110 formed of a chemically-strengthen glass disk can be obtained.

On the base 110, films of the adhesion layer 120 to the auxiliary recording layer 200 are sequentially formed by DC magnetron sputtering, and a film of the protective layer 210 can be formed by CVD. Thereafter, the lubricating layer 220 can be formed by dip coating. The structure of each layer is described below.

The adhesion layer 120 is formed so as to be in contact with the base 110, and has a function of enhancing a close contact strength between the film of the soft magnetic layer 130 formed thereon and the base 110. The adhesion layer 120 is preferably an amorphous alloy film, such as a CrTi-base amorphous alloy, a CoW-base amorphous alloy, a CrW-base amorphous alloy, a CrTa-base amorphous alloy, or a CrNb-base amorphous alloy. The adhesion layer 120 can have a film thickness, for example, on the order of 2 nm to 20 nm. The adhesion layer 120 may be a single layer, and may be formed by laminating a plurality of layers.

The soft magnetic layer 130 functions as helping facilitate writing of a signal in the magnetic layer (the lower group 160 and the upper group 180), which will be described further below, and increase density by convergence of a write magnetic field from the head when a signal is recorded by a perpendicular magnetic recording scheme. As a soft magnetic material, in addition to a cobalt-base alloy such as CoTaZr, a FeCo-base alloy such as FeCoCrB, FeCoTaZr, and FeCoNiTaZr and a material with soft magnetic characteristics such as a NiFe-base alloy can be used. Also, by involving a spacer layer made of Ru approximately in the middle of the soft magnetic layer 130, the structure can be configured so as to have AFC (Antiferro-magnetic exchange coupling). With this, perpendicular components of magnetization can be extremely decreased, and therefore noise occurring from the soft magnetic layer 130 can be reduced. In the case of the structure in which the spacer layer is involved, the film thickness of the soft magnetic layer 130 can be such that the spacer layer has a film thickness on the order of 0.3 nm to 0.9 nm and layers thereabove and therebelow made of a soft magnetic material each have a film thickness on the order of 10 nm to 50 nm.

The preliminary ground layer 140 has a function of promoting crystal orientation of the ground layer 150 formed thereabove and a function of controlling a microfabricated structure, such as a particle diameter. The preliminary ground layer 140 may have a hcp structure, but preferably has a face-centered cubic structure (a fcc structure) in which a (111) surface is parallel to a main surface of the base 110. Examples of the material of the preliminary ground layer 140 can include Ni, Cu, Pt, Pd, Ru, Co, and Hf, and an alloy having any of the above-described metals as a main component and having added thereto one or more of V, Cr, Mo, W, Ta, and others. Specifically, a selection can be suitably made from NiV, NiCr, NiTa, NiW, NiVCr, CuW, CuCr, and others. The preliminary ground layer 140 can have a film thickness on the order of 1 nm to 20 nm. Also, the preliminary ground layer 140 may have a plural-layer structure.

The ground layer 150 is a layer having a hcp structure, having a function of promoting crystal orientation of magnetic crystal particles (hereinafter referred to as magnetic particles) in the hcp structure of the magnetic layers formed thereabove (the lower group 160 and the upper group 180) and a function of controlling microfabricated structure, such as a particle diameter, and serving as a so-called basis of a granular structure. Ru has a hcp structure as that of Co, and a lattice space of the crystal is similar to that of Co. Therefore, magnetic particles having Co as a main component can be excellently orientated. Therefore, as crystal orientation of the ground layer 150 is higher, crystal orientation of the magnetic layers can be improved. Also, by microfabricating the particle diameter of the ground layer 150, the particle diameter of the magnetic particles of the magnetic layers can be microfabricated. While Ru is typical as a material of the ground layer 150, furthermore, a metal, such as Cr or Co, or an oxide can be added. The film thickness of the ground layer 150 can be, for example, on the order of 5 to 40 nm.

Also, by changing gas pressure at the time of sputtering, the ground layer 150 may be formed in a two-layer structure. Specifically, when gas pressure of Ar when the upper layer side of the ground layer 150 is formed is higher than that when the lower layer side thereof is formed, the particle diameter of the magnetic particles can be microfabricated while crystal orientation of the upper magnetic layers is excellently maintained.

In the present embodiment, the lower group 160 (the first granular magnetic layers) is formed of three layers configured of a first lower magnetic layer 162, a second lower magnetic layer, and a third lower magnetic layer 166. These magnetic layers each have a granular structure in a columnar shape in which a non-magnetic substance having an oxide as a main component is segregated around the magnetic particles with ferromagnetic properties having a Co—Pt-base alloy as a main component to form a grain boundary. For example, by forming a film with the use of a target obtained by mixing $SiO_2$, $TiO_2$, or the like in a CoCrPt-base alloy, $SiO_2$ or $TiO_2$, which is a nonmagnetic substance, is segregated around the magnetic particles (grains) formed of a CoCrPt-base alloy to form a grain boundary, and a granular structure with the magnetic particles growing in a columnar shape can be formed.

In the present embodiment, in these three layers, layers closer to the front surface are set to have an equal or smaller content of Pt and an equal or larger content of an oxide. As the content of Pt is increased, crystal orientation is improved to increase coercive force, but noise also tends to be increased. As the content of the oxide is increased, separability of the magnetic particles is improved to reduce the SNR. However, if the oxide is added too much, separation is too much to possibly weaken signals and weaken resistance to heart fluctuation. In this trade-off relation, by setting the contents of Pt and the oxide in the manner as described above, the first lower magnetic layer 162 plays a role of improving crystal orientation, and the second lower magnetic layer 164 and the third lower magnetic layer 166 play a role of improving the SNR. With this sharing of functions (sharing of roles), crystal orientation and the SNR can both be improved.

Note that in these three layers, layers closer to the front surface are preferably set to have a thicker film thickness. This means that layers with a higher SNR has a thicker thickness. With the lower group 160 designed to focus on the SNR as a whole, an increase in recording density can be promoted.

Specifically, the first lower magnetic layer 162 preferably has Pt equal to or larger than 18 atomic percent and equal to or smaller than 24 atomic percent and an oxide equal to or larger than 4 mole percent and equal to or smaller than 8 mole percent. With this, the first lower magnetic layer 162, which is the lowermost layer of the lower group 160, can be made as a magnetic layer having high crystal orientation and coercive force. Also, as described above, the second lower magnetic layer 164 and the third lower magnetic layer 166, which are magnetic layers thereabove, have an equivalent or smaller content of Pt and an equal or larger content of an oxide, and therefore can be made as layers having a high SNR.

Note that the substances described above is merely an example, and is not restrictive. As a CoCrPt-base alloy, one or more types of B, Ta, Cu, and others may be added to CoCrPt. Also, examples of a non-magnetic substance for forming a grain boundary can include oxides, such as silicon oxide (SiO2), titanium oxide (TiO2), chrome oxide (Cr2O3), zircon oxide (ZrO2), tantalum oxide (Ta2O5), cobalt oxide (CoO or Co3O4). Also, not only one type of oxide but also two or more types of oxide can be combined for use.

Among these, preferably, the first lower magnetic layer 162, which is the lowermost layer of the lower group 160, does not contain SiO2 and TiO2 as an oxide and the second lower magnetic layer 164, which is the second layer when viewed from a base side, contains SiO2 or TiO2 as an oxide. In the present embodiment, CoCrPt—Cr2O3 is used for the first lower magnetic layer 162, and CoCrPt—SiO2-TiO2 is used for the second lower magnetic layer 164 and the third lower magnetic layer 166.

Compared with SiO2 and TiO2 often used for a granular magnetic layer, Cr2O3 has low separability but high crystal orientation. Therefore, by adding Cr2O3 to the lowermost first lower magnetic layer 162, crystal orientation of the second lower magnetic layer 164 and the third lower magnetic layer 166 positioned thereabove can be improved. And, by using SiO2 or TiO2 for the second layer in each magnetic layer group, separability can be improved, and crystal orientation and separability can be both achieved as a whole.

The non-magnetic layer 170 is a non-magnetic thin film, and is involved between the lower group 160 and the upper group 180 to adjust the strength of ferromagnetic coupling therebetween. With this, the lower group 160 and the upper group 180 are independent from each other and are able to be subjected to magnetization reversal and also to assist reversal of the lower magnetic layer with an appropriate interaction.

The non-magnetic layer 170 is preferably formed of Ru or a Ru compound (for example, 50Ru-50Co). The reason for this is that, since Ru has an atomic space similar to that of Co forming the magnetic particles, even Ru is involved in the magnetic recording layer 122, epitaxial growth of crystal particles of Co is less prone to be inhibited. Also, epitaxial growth is less prone to be inhibited because the non-magnetic layer 170 is extremely thin.

In the present embodiment, the upper group 180 (the second granular magnetic layers) is formed of two layers configured of a first upper magnetic layer 182 and a second upper magnetic layer 184. As with the lower group 160, these magnetic layers each have a granular structure.

In the present embodiment, as with the lower group 160, also in the two layers of the upper group 180, layers closer to the front surface are set to have an equal or smaller content of Pt and an equal or larger content of an oxide. By setting the contents of Pt and the oxide in the manner as described above, the first upper magnetic layer 182 plays a role of improving crystal orientation, and the second upper magnetic layer 184 play a role of improving the SNR. With this sharing of functions (sharing of roles), crystal orientation and the SNR can both be improved. Also, by setting layers closer to the front surface so that they have a thicker film thickness, the upper group 180 can also be designed to focus on the SNR as a whole.

As with the first lower magnetic layer 162, the first upper magnetic layer 182 preferably has Pt equal to or larger than 18 atomic percent and equal to or smaller than 24 atomic percent and an oxide equal to or larger than 4 mole percent and equal to or smaller than 8 mole percent. With this, the first upper magnetic layer 182, which is the lowermost layer of the upper group 180, can be made as a magnetic layer having high crystal orientation and coercive force. Also, as described above, the second upper magnetic layer 184, which is a magnetic layer thereabove, has an equivalent or smaller content of Pt and an equal or larger content of an oxide, and therefore can be made as a layer having a high SNR.

Furthermore, preferably, the first upper magnetic layer 182, which is the lowermost layer of the upper group 180, does not contain SiO2 and TiO2 as an oxide and the second upper magnetic layer 184, which is the second layer when viewed from a base side, contains SiO2 or TiO2 as an oxide. In the present embodiment, CoCrPt—Cr2O3 is used for the first upper magnetic layer 182, and CoCrPt—SiO2-TiO2 is used for the second upper magnetic layer 184. With this, by function sharing of improving crystal orientation with the first upper magnetic layer 182 and improving the SNR with the second upper magnetic layer 184, improvement in both crystal orientation and the SNR can be achieved.

The dividing layer 190 is provided between the upper group 180 and the auxiliary recording layer 200, and has an action of adjusting the strength of exchange coupling between these layers. With this, the strength of a magnetic interaction acting between the upper group 180 and the auxiliary recording layer 200 and between adjacent magnetic particles in the upper group 180 (in particular, in the second upper magnetic layer 184) can be adjusted. With this, while magnetostatic values, such as a coercive force Hc and an inverted-magnetic-domain nucleation magnetic field Hn, relating to heat fluctuation resistance are kept, recording and reproduction characteristics, such as an overwrite characteristic and an SNR characteristic, can be improved.

The dividing layer 190 is preferably a layer having a hcp crystal structure and having Ru or Co as a main component so as not to decrease inheritance of crystal orientation. As a Ru-base material, in addition to Ru, a material obtained by adding another metal, oxygen, or an oxide to Ru can be used. Also, as a Co-base material, a CoCr alloy or the like can be used. Specific examples include Ru, RuCr, RuCo, Ru—SiO$_2$, Ru—WO$_3$, Ru—TiO$_2$, CoCr, CoCr—SiO$_2$, CoCr—TiO$_2$, or the like can be used. Note that a non-magnetic material is normally used for the dividing layer 190, but the dividing layer may have low magnetic properties. Furthermore, in order to obtain excellent exchange coupling strength, the dividing layer 190 may preferably have a film thickness within 0.2 nm to 1.0 nm.

Still further, the dividing layer 190 has an action to the structure to promote separation of the crystal particles of the upper auxiliary recording layer 200. For example, even when the upper layer is made of a material not containing a non-magnetic substance, such as an oxide, the grain boundary of the magnetic crystal particles can be clarified.

Note that while the structure in the present embodiment is such that the dividing layer 190 is provided between the upper group 180 and the auxiliary recording layer 200, this is not meant to be restrictive. Therefore, the structure may be such that a film of the auxiliary recording layer 200 is formed directly above the upper group 180 without provision of the dividing layer 190. This is because the upper group 180 is close to the surface of the medium and therefore the write magnetic field of the head is relatively strong and approximately similar characteristics can be obtained even without adjusting the magnetic interaction with the dividing layer 190.

The auxiliary recording layer 200 is a magnetic layer magnetically approximately continuous in an in-plane direction of a main surface of the base. As the auxiliary recording layer 200, a CoCrPtRu alloy can be used and, furthermore, an additive, such as B, Ta, or Cu, may be added. Specifically, the auxiliary recording layer 200 can be made of CoCrPtRu, CoCrPtRuB, CoCrPtRuTa, CorCrPtRuCu, CoCrPtRuCuB, or others. Since the auxiliary recording layer 200 has a magnetic interaction (exchange coupling) with respect to the upper group 180, magnetostatic characteristics, such as the coercive force Hc and the inverted-magnetic-domain nucleation magnetic field Hn, can be adjusted. With this, an object is to improve heat fluctuation resistance, the OW characteristic, and the SNR.

Note that "magnetically continuous" means that magnetic properties continue without interruption. "approximately continuous" means that the auxiliary recording layer 200 is not necessarily a single magnet when observed as a whole but the magnetic properties may be partially discontinuous. That is, the auxiliary recording layer 200 can have continuous magnetic properties across (so as to cover) a collective body of a plurality of magnetic particles. As long as this condition is satisfied, the auxiliary recording layer 200 may have a structure in which, for example, Cr is segregated.

The protective layer 210 is a layer for protecting the perpendicular magnetic disk 100 from a shock from the magnetic head. The protective layer 210 can be formed by forming a film containing carbon by CVD. In general, a carbon film formed by CVD has an improved film hardness compared with a film formed by sputtering, and therefore is suitable because it can more effectively protect the perpendicular magnetic disk 100 from a shock from the magnetic head. The protective layer 210 can have a film thickness of, for example, 2 nm to 6 nm.

The lubricating layer 220 is formed so as to prevent damage on the protective layer 210 when the magnetic head makes contact with the surface of the perpendicular magnetic disk 100. For example, a film can be formed by applying PFPE (perfluoropolyether) by dip coating. The lubricating layer 220 can have a film thickness of, for example, 0.5 nm to 2.0 nm.

Meanwhile, according to the structure described above, by dividing the lower group 160 and the upper group 180 by the non-magnetic layer 170, the magnetic interaction between the upper group 180 and the lower group 160 is weakened. Also, between the upper group 180 and the auxiliary recording layer 200, the strength of the magnetic interaction can be adjusted by the dividing layer 190. For this reason, when writing is performed from the magnetic head, the auxiliary recording layer 200 is first subjected to magnetization reversal, the upper group 180 ferromagnetically coupled thereto is then subjected to magnetization reversal, and next the lower group 160 ferromagnteically coupled to the upper group 180 is subjected to magnetization reversal.

That is, a group of magnetic layers including the auxiliary recording layer 200 and the upper group 180 functions so as to assist recording onto the lower group 160. With this, the state becomes as if a small medium (the auxiliary recording layer 200 and the upper group 180) is present in a large medium (the auxiliary recording layer 200, the upper group 180, and the lower group 160). Then, with the auxiliary recording layer 200 being subjected to magnetization reversal, magnetization reversal occurs over the entire medium in an avalanchine manner (in a chain-reacting manner).

As such, by restricting the magnetic layer to be assisted by the auxiliary recording layer 200 in magnetization reversal to part (the upper group 180) of the granular layers, the effect of reducing coercive force required for the auxiliary recording layer 200 can be decreased, and thus the film of the auxiliary recording layer 200 can be made thinner. Therefore, noise occurring from the auxiliary recording layer 200 can be reduced, the SNR can be improved, and recording density can be increased.

Here, the upper group 180 and the lower group 160 each have a structure similar to that in a general magnetic recording disk. That is, in either group, a layer with more PT and high crystal orientation is formed on a base side and a layer with a more oxide and high SNR is formed on a surface side, and the auxiliary recording layer 200 (or the auxiliary recording layer 200 and the upper group 180) is provided thereon to prevent heat fluctuation. From this, unlike the case of simply increasing the thickness of the auxiliary recording layer 200 or providing two auxiliary recording layers 200, it is possible to make the film thinner while keeping the function as the auxiliary recording layer 200 and increase the SNR.

Furthermore, when a sum of the film thickness of the lower group 160, the film thickness of the upper group 180, and the film thickness of the auxiliary recording layer 200 is taken as T1, a sum of the film thickness of the upper group 180 and the film thickness of the auxiliary recording layer 200 is taken as T2, and the film thickness of the auxiliary recording layer 200 is T3, T1/2>T2 and T2/2>T3 are preferably satisfied. With the relation among the film thicknesses as described above, the operation can be ensured such that the auxiliary recording layer 200 is subjected to magnetization reversal, the upper group 180 is next subjected to magnetization reversal, and then the lower group 160 is subjected to magnetization reversal. Therefore, these layers can be reliably subjected to magnetization reversal in a chain-reacting manner.

EXAMPLES

To confirm effectiveness of the above-structured perpendicular magnetic disk 100, the following examples and comparative examples are used for description.

As an example, on the base 110, by using a vacuumed film forming device, films of the adhesion layer 120 to the auxiliary recording layer 200 were sequentially formed in an Ar atmosphere by DC magnetron sputtering. Note that the Ar gas pressure at the time of film formation is 0.6 Pa unless otherwise specified. For the adhesion layer 120, a film was formed of Cr-50Ti so as to have 10 nm. For the soft magnetic layer 130, films were formed of 92(40Fe-60Co)-3Ta-5Zr so as to interpose a Ru layer of 0.7 nm therebetween and each have 20 nm. As the preliminary ground layer 140, a film was formed of Ni-5W so as to have 8 nm. For the ground layer 150, a film was formed of Ru at 0.6 Pa so as to have 10 nm and then a film was formed of Ru at 5 Pa so as to have 10 nm. For the lower group 160, a film was formed of 93(68Co-10Cr-20Pt—)-7 (Cr2O3) so as to have 1.1 nm as the first lower magnetic layer 162, a film was formed of 90(71Co-11Pt-18Cr)-5SiO2-

5TiO2 so as to have 4.6 nm as the second lower magnetic layer 164, and a film was formed of 90(69Co-12Pt-16Cr-3Ru)-5SiO2-5TiO2 so as to have 8.8 nm as the third lower magnetic layer 166. For the non-magnetic layer 170, a film was formed of 50Ru50Co at 3 Pa so as to have 0.48 nm. For the upper group 180, a film was formed of 93(68Co-10Cr-20Pt—)-7(Cr2O3) so as to have 3.2 nm as the first upper magnetic layer 182, and a film was formed of 90(67Co-14Cr-16Pt-3Ru)-5SiO2-5TiO2 so as to have 1.3 nm as the second upper magnetic layer 184. For the dividing layer 190, a film was formed of Ru so as to have 0.3 nm. For the auxiliary recording layer 200, a film was formed of 64Co-5Pt-15Cr-8B-8Ru so as to have 3.3 nm. For the protective layer 210, a film was formed by using C2H4 by CVD so as to have 4.0 nm, and then its surface layer was nitrided. The lubricating layer 220 was formed by using PFPE by dip coating so as to have 1.0 nm.

In the example described above, the first lower magnetic layer 162 and the first upper magnetic layer 182 have the same composition. Note that the film thickness of the auxiliary recording layer 200 and the compositions of the first lower magnetic layer 162 and the first upper magnetic layer 182 are changed in a manner as will be described below for comparison and study.

Figure 2:
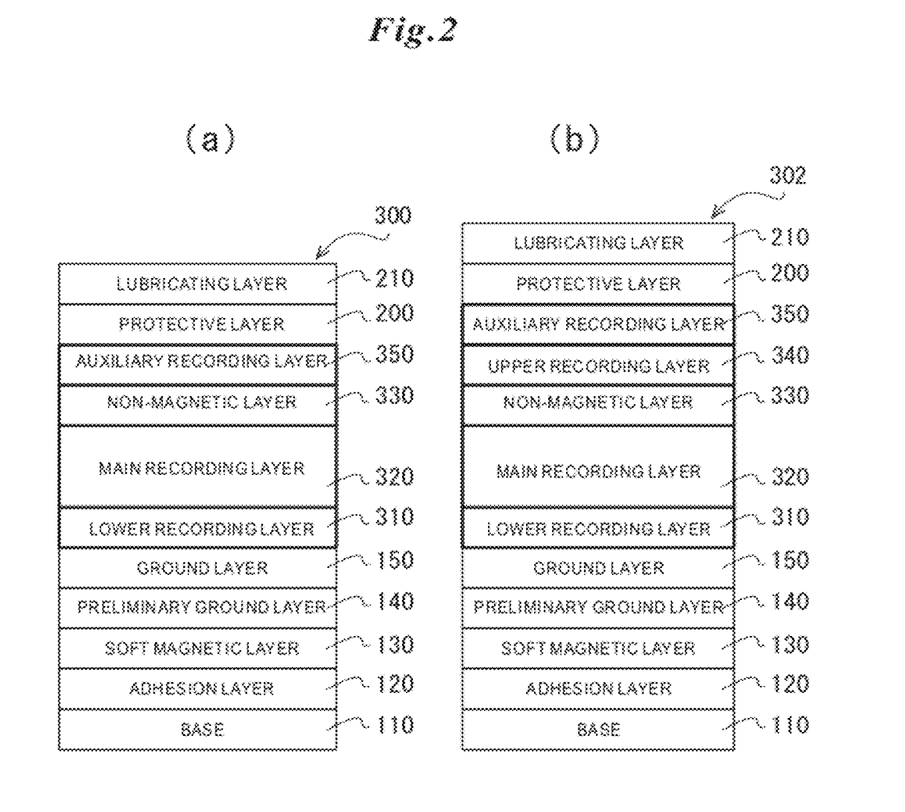
FIG. 2 Drawings for describing the film structure in comparative examples.

FIG. 2 depicts drawings for describing the film structure in comparative examples. FIG. 2(a) depicts the film structure of a perpendicular magnetic disk 300 of a comparative example 1, the structure obtained by forming a film of 90(70Co-10Cr-20Pt)-10(Cr2O3) with 2 nm at 3 Pa as a lower recording layer 310 and then forming a film of 90(72Co-10Cr-18Pt)-5(SiO2)-5(TiO2) with 12 nm at 3 Pa as a main recording layer 320. For a non-magnetic layer 330, a film of Ru was formed so as to have 0.3 nm. For an auxiliary recording layer 350, a film of 62Co-18Cr-15Pt-5B was formed. The rest of the films is similar to those of the present example. In comparison between the example depicted in FIG. 1 and the comparative example 1 of FIG. 2(a) in structure, the lower recording layer 310 serves as the first lower magnetic layer 162, and the main recording layer 320 serves as the second lower magnetic layer 164 and the third lower magnetic layer 166.

FIG. 2(b) depicts the film structure of a perpendicular magnetic disk 302 of a comparative example 2, the structure obtained by adding, in the structure of the comparative example 1, an upper recording layer 340 between the non-magnetic layer 330 and the auxiliary recording layer 350. The upper recording layer 340 has a granular structure and, as with the lower recording layer 310, a film was formed of 90(70Co-10Cr-20Pt)-10(Cr2O3) with 2 nm at 3 Pa. Since the non-magnetic layer 330 is disposed between the upper recording layer 340 and the main recording layer 320, the upper recording layer 340 is subjected to magnetization reversal together with the auxiliary recording layer 350, thereby assisting reversal of the lower magnetic layer. In other words, the structure of the comparative example 2 includes an auxiliary recording layer of a two-layer structure. In comparison between the example depicted in FIG. 1 and the comparative example 2 of FIG. 2(b), the lower recording layer 310 serves as the first lower magnetic layer 162, the main recording layer 320 serves as the second lower magnetic layer 164 and the third lower magnetic layer 166, and the upper recording layer 340 serves as the second upper magnetic layer 184 (there is no layer corresponding to the first upper magnetic layer 182).

Figure 3:
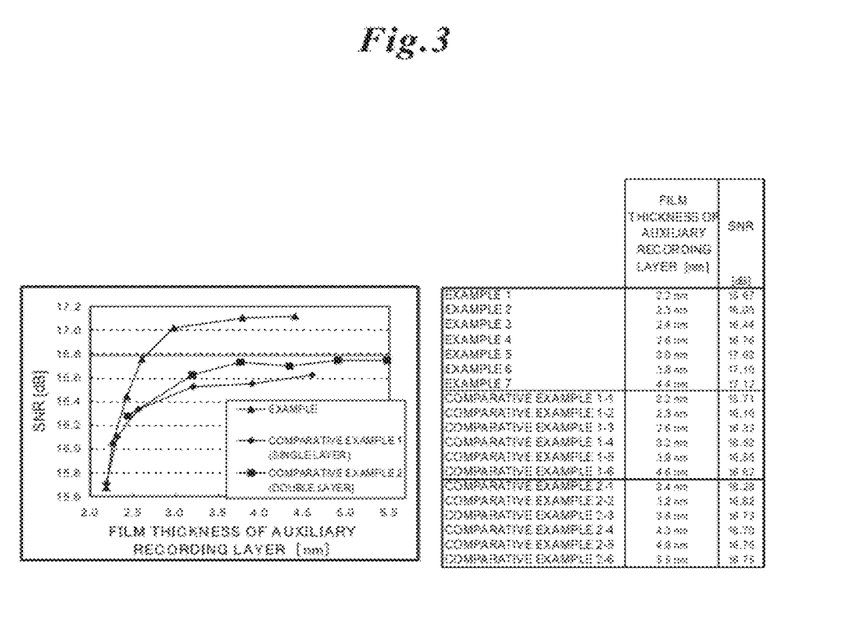
FIG. 3 A drawing for comparing SNRs when the film thickness of an auxiliary recording layer is changed.

FIG. 3 is a drawing for comparing SNRs when the film thickness of the auxiliary recording layer is changed. In examples 1 to 7, the film thickness of the auxiliary recording layer 200 in the structure of the example depicted in FIG. 1 is changed from 2.2 nm to 4.4 nm. In comparative examples 1-1 to 1-6, the film thickness of the auxiliary recording layer 350 in the structure of the comparative example 1 depicted in FIG. 2(a) is changed from 2.2 nm to 4.6 nm. In comparative examples 2-1 to 2-6, the film thickness of the auxiliary recording layer 350 in the structure of the comparative example 2 depicted in FIG. 2(b) is changed from 2.4 nm to 5.5 nm.

With reference to FIG. 3, firstly, it can be found in the comparative example 2 with two layers of the upper recording layer 340 and the auxiliary recording layer 350 that, compared with the comparative example 1 including only the single-layered auxiliary recording layer 350, the SNR is higher when the film thickness of the auxiliary recording layer 350 is approximately the same. The reason for this can be thought that, with the provision of the upper recording layer 340, write spread is suppressed to reduce noise.

By contrast, in the examples, it can be found that the SNR is further improved dramatically and a sufficient SNR is obtained from a region having a thin film thickness of the auxiliary recording layer. The reason for this can be thought such that, compared with the comparative example 2 in which the upper recording layer 340 is simply added, the second upper magnetic layer 184 with a high SNR is provided on the first upper magnetic layer 182 that guarantees crystal orientation and coercive force. That is, with the film structure being made as if a small medium is present from above the non-magnetic layer 170, the SNR can be dramatically improved with the thin auxiliary recording layer 200.

Figure 4:
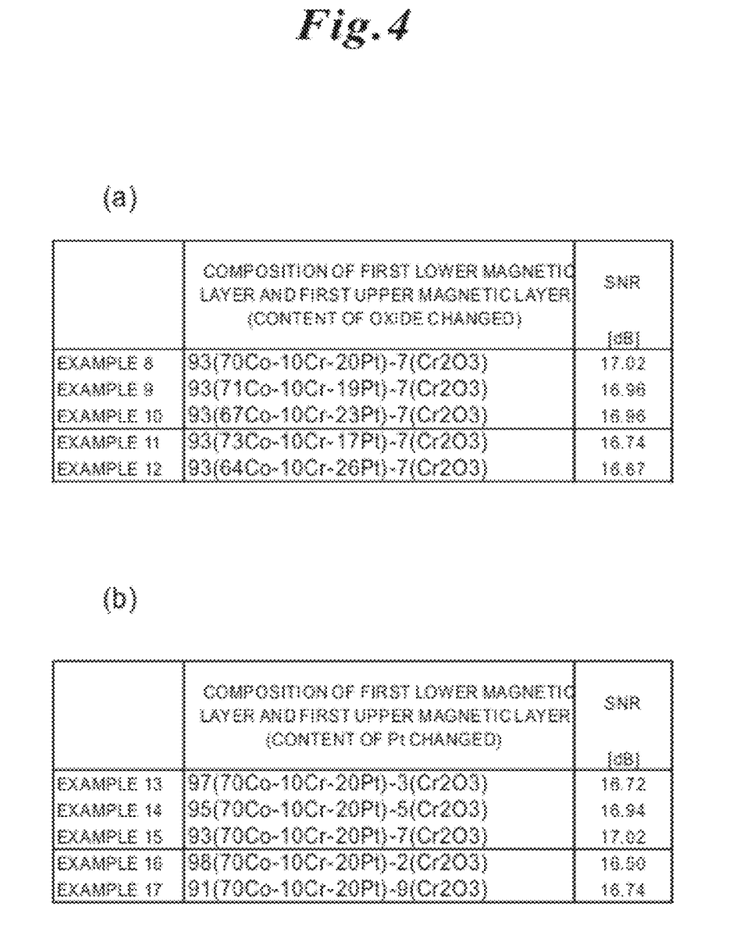
FIG. 4 Drawings for studying the compositions of a first lower magnetic layer and a first upper magnetic layer in the structure of an example.

FIG. 4 depicts drawings for studying the compositions of the first lower magnetic layer 162 and the first upper magnetic layer 182 in the structure of the example. In FIG. 4, the first lower magnetic layer 162 and the first upper magnetic layer 182 are both changed in composition as depicted.

In FIG. 4(a), the content of Pt is changed. The content of Pt is changed in the examples 8 to 12 from 17 atomic percent to 26 atomic percent. As depicted in the drawing, from the examples 8 to 10, the SNR is improved as Pt is increased. However, when the content is exceeded, the SNR is decreased as Pt is increased. With reference to FIG. 3, since an upper limit to be reached by the SNR in the comparative example is approximately 16.8 dB, the content of Pt allowing a higher SNR to be reached is 18 atomic percent to 24 atomic percent, and therefore it can be found that it is preferable to set this range.

In FIG. 4(b), the content of the oxide is changed. The content of the oxide is changed in the examples 13 to 17 from 2 mole percent to 9 mole percent. Note that while the example 10 and the example 16 have the same composition, different numerals are provided for convenience of description. As depicted in the drawing, from the examples 13 to 16, the SNR is improved as the oxide is increased. However, in the example 17 containing a far more oxide, the SNR is decreased. Thus, it can be found that the content of the oxide allowing the upper limit of 16.8 dB or higher of the SNR in the comparative example 2 to be achieved is 4 mole percent to 8 mole percent and it is preferable to set this range.

Figure 5:
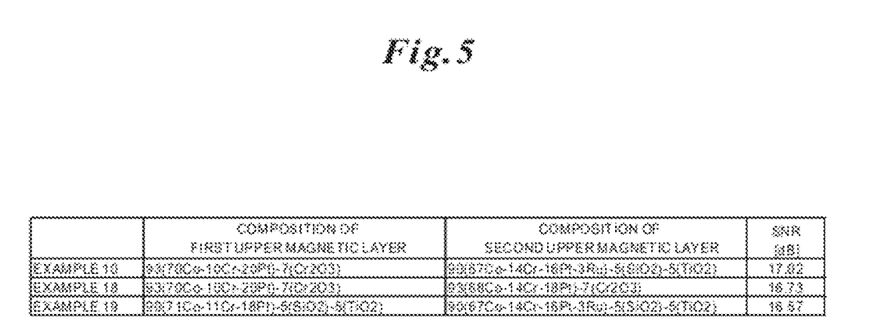
FIG. 5 A drawing for studying oxides of the first upper magnetic layer and a second upper magnetic layer in an upper group.

FIG. 5 is a drawing for studying oxides for the first upper magnetic layer 182 and the second upper magnetic layer 184 in the upper group 180. The example 10 described above and examples 18 and 19 are now compared with each other. In the structure of the example 10, the first upper magnetic layer 182 is made of 93(70Co-10Cr-20Pt)-7(Cr2O3), and the second upper magnetic layer 184 is made of 90(67Co-14Cr-16Pt-3Ru)-5(SiO2)-5(TiO2). In the example 18, Cr2O3 is used as an oxide for the second upper magnetic layer 184, which is made of 93(68Co-14Cr-18Pt)-7(Cr2O3). In the example 19, SiO2 and TiO2 are used for the first upper magnetic layer 182, which is made of 90(71Co-11Cr-18Pt)-5(SiO2)-5(TiO2). In comparison between these, the example 10 has a higher SNR than those of the examples 18 and 19. Note that, although not shown, similar results were obtained in the lower group 160.

From FIG. 5, it can be found that, preferably, the first upper magnetic layer 182, which is the lowermost layer of the upper group 180, does not contain SiO2 and TiO2 as an oxide and the second upper magnetic layer 184, which is the second layer when viewed from a base side, contains SiO2 or TiO2 as an oxide. The reason for this can be thought such that, in the lower layer, crystal orientation is improved with Cr2O3 and separability is improved by using SiO2 or TiO2 for the second layer, thereby achieving both of crystal orientation and separability as a whole.

Figure 6:
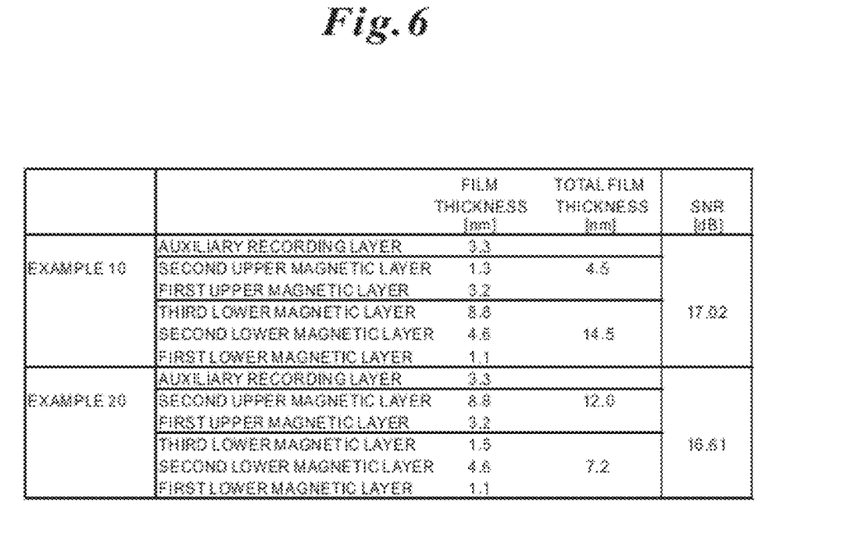
FIG. 6 A drawing for studying the relation among film thicknesses.

FIG. 6 is a drawing for studying the relation among film thicknesses. The film thickness of the example 10 as described above is as depicted in FIG. 6. A sum of the film thicknesses of the lower group 160, the upper group 180, and the auxiliary recording layer 200 is taken as T1, a sum of the film thicknesses of the upper group 180 and the auxiliary recording layer 200 is taken as T2, and the film thickness of the auxiliary recording layer 200 is taken as T3. Since the film thickness of the lower group 160 (a total of the first lower magnetic layer 162 to the third lower magnetic layer 166) is 1.1 nm+4.6 nm+8.8 nm=14.5 nm, the film thickness of the upper group 180 (a total of the first upper magnetic layer 182 and the second upper magnetic layer 184) is 3.2 nm+1.3 nm=4.5 nm, and the film thickness of the auxiliary recording layer 200 is 3.3 nm, T1=22.3 nm, T2=7.8 nm, and T3=3.3 nm. Therefore, these satisfy the relation of T1/2>T2 and T2/2>T3.

In an example 20, the composition is the same, and the lower group 160 is made thinner and the upper group 180 is made thicker. Each detailed film thickness is as shown in the drawing: T1=22.5 nm, T2=15.3 nm, and T3=3.3 nm. These do not satisfy the relation of T1/2>T2 and T2/2>T3.

With reference to FIG. 6, it can be found that the example 10 has a higher SNR than that of the example 20. The reason for this can be thought such that, in the example 10, with the relation between the film thicknesses as described, the operation can be ensured such that the auxiliary recording layer 200 is subjected to magnetization reversal, the upper group 180 is next subjected to magnetization reversal, and then the lower group 160 is subjected to magnetization reversal, and these layers can be reliably subjected to magnetization reversal in a chain-reacting manner.

Figure 7:
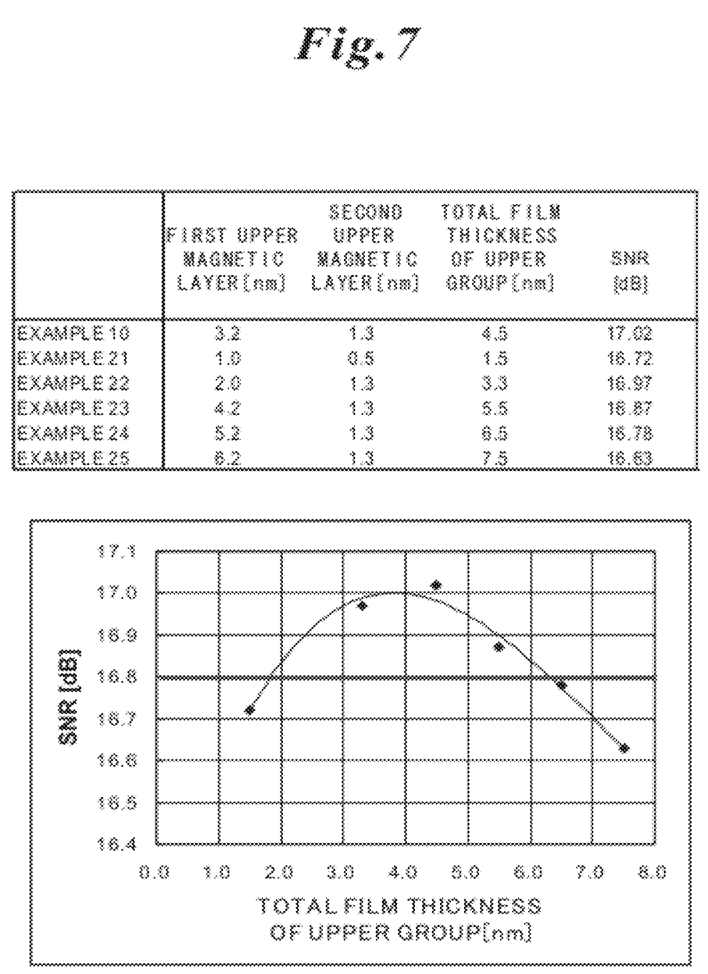
FIG. 7 A drawing for studying a total film thickness of the upper group.

FIG. 7 is a drawing for studying a total film thickness of the upper group 180. As depicted in FIG. 7, in the example 10 to examples 21 to 25, the film thicknesses of the first upper magnetic layer 182 and the second upper magnetic layer 184 are variously changed to compare SNRs. Their compositions are similar to that of the example 10.

With reference to FIG. 7, when the total film thickness of the upper group 180 is changed, a high SNR can be obtained even with 1.5 nm, but its peak is near 4.0 nm and the SNR is decreased with 7.5 nm. If the film thickness is thinner than 1.5 nm, the lower group 160 becomes less prone to reversal even with the auxiliary recording layer 200 and the upper group 180 together, and this is thought to be the reason for decreasing the SNR. If the film thickness is thicker than 7.0 nm, the effect of making the auxiliary recording layer 200 thinner cannot be obtained, and this is thought to be the reason for decreasing the SNR. From these, it can be found that the total film thickness of the upper group 180 is preferably equal to or larger than 1.5 nm and equal to or smaller than 7.0 nm. More preferably, as a range capable of achieving the upper limit of 16.8 dB of the SNR of the comparative example 2 or higher, the total film thickness is preferably equal to or large than 2.0 nm and equal to or smaller than 6.0 nm.

Note that in the studies of the above examples and FIG. 4, description has been made on the assumption that the first lower magnetic layer 162 and the first upper magnetic layer 182 have the same composition. However, the first lower magnetic layer 162 and the first upper magnetic layer 182 are not necessarily required to have the same composition as long as they achieve the object of guaranteeing both of crystal orientation and coercive force, that is, as long as the structure has high crystal orientation.

In the foregoing, the preferred embodiments of the present invention have been described with reference to the attached drawings. Needless to say, however, the present invention is not restricted to these embodiments. It is clear that the person skilled in the art can conceive various modification examples or corrected examples within a range described in the scope of claims for patent, and it is understood that they reasonably belong to the technological scope of the present invention.

INDUSTRIAL APPLICABILITY

The present invention can be used as a perpendicular magnetic disk implemented on an HDD of a perpendicular magnetic recording type.

DESCRIPTION OF REFERENCE NUMERALS

100 . . . perpendicular magnetic disk,
110 . . . base,
120 . . . adhesion layer,
130 . . . soft magnetic layer,
140 . . . preliminary ground layer,
150 . . . ground layer,
160 . . . lower group,
162 . . . first lower magnetic layer,
164 . . . second lower magnetic layer,
166 . . . third lower magnetic layer,
170 . . . non-magnetic layer,
180 . . . upper group,
182 . . . first upper magnetic layer,
184 . . . second upper magnetic layer,
190 . . . dividing layer,
200 . . . auxiliary recording layer,
210 . . . protective layer,
220 . . . lubricating layer,
310 . . . lower recording layer,
320 . . . main recording layer,
330 . . . non-magnetic layer,
340 . . . upper recording layer,
350 . . . auxiliary recording layer

The invention claimed is:

1. A perpendicular magnetic disk comprising:
on a base and in the order from bottom,
a first granular magnetic layer group consisting of a plurality of magnetic layers each having a granular structure;
a non-magnetic layer having Ru or a Ru alloy as a main component;
a second granular magnetic layer group consisting of a plurality of magnetic layers each having the granular structure; and
an auxiliary recording layer having a CoCrPtRu alloy as a main component,
wherein the magnetic layers of the first granular magnetic layer group that are closer to a top surface of an uppermost layer of the first granular magnetic layer group have an equal or smaller content of Pt than the magnetic layers of the first granular magnetic layer group that are closer to a bottom surface of a lowermost layer of the first granular magnetic layer group, wherein the magnetic layers of the second granular magnetic layer group that are closer to a top surface of an uppermost layer of the second granular magnetic layer group have an equal or smaller content of Pt and have a larger content of an oxide than the magnetic layers of the second granular magnetic layer group that are closer to a bottom surface of a lowermost layer of the second granular magnetic layer group, wherein the lowermost layer of each of the first granular magnetic layer group and the second granular magnetic layer group contains $Cr_2O_3$ and does not contain $SiO_2$ and $TiO_2$ as an oxide forming a grain boundary having the granular structure, wherein a second lowermost layer of each of the first granular magnetic layer group and the second granular magnetic layer group contain $SiO_2$ or $TiO_2$ as an oxide forming a grain boundary having the granular structure, and wherein the first granular magnetic layer group, the second granular magnetic layer group and the auxiliary recording layer satisfy the following requirement:

$T_1/2 > T_2$ and $T_2/2 > T_3$, wherein $T_1$ represents the sum of the thickness of the first granular magnetic layer group, the thickness of the second granular magnetic layer group and the thickness of the auxiliary recording layer, $T_2$ represents the sum of the thickness of the second granular magnetic layer group and the auxiliary recording layer and $T_3$ represents the thickness of the auxiliary recording layer.

2. The perpendicular magnetic disk according to claim 1, wherein
the lowermost layer of each of the first granular magnetic layer group and the second granular magnetic layer group has a Pt content of 18 atomic percent to 24 atomic percent and an oxide content of 4 mole percent to 8 mole percent.

3. The perpendicular magnetic disk according to claim 1, wherein a total film thickness of the second granular magnetic layer group is 1.5 nm to 7.0 nm.

4. The perpendicular magnetic disk according to claim 1, wherein a total film thickness of the second granular magnetic layer group is 2.0 nm to 6.0 nm.

5. The perpendicular magnetic disk according to claim 1, wherein the magnetic layers of the first granular magnetic layer group that are closer to the top surface of the uppermost layer of the first granular magnetic layer group have a thicker film thickness than the magnetic layers of the first granular magnetic layer group that are closer to the bottom surface of the lowermost layer of the first granular magnetic layer group.

6. The perpendicular magnetic disk according to claim 1, wherein the lowermost layer of each of the first granular magnetic layer group and the second granular magnetic layer group comprises a CoCrPtRu alloy as a main component, and has a Pt content of 18 atomic percent to 24 atomic percent and an oxide content of 4 mole percent to 8 mole percent, and
wherein the perpendicular magnetic disk has a SNR higher than 16.8 dB.

7. The perpendicular magnetic disk according to claim 1, wherein a total film thickness of the second granular magnetic layer group is 2.0 nm to 6.0 nm, and the perpendicular magnetic disk has a SNR higher than 16.8 dB.

* * * * *